United States Patent
van Straten et al.

(10) Patent No.: US 9,190,350 B2
(45) Date of Patent: Nov. 17, 2015

(54) SEMICONDUCTOR DEVICE LEADFRAME

(71) Applicant: NXP B.V., Eindhoven (NL)

(72) Inventors: Freek Egbert van Straten, Mook (NL); Jeremy Joy Montalbo Incomio, Santa Rosa (PH); Albertus Reijs, Molenhoek (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/478,683

(22) Filed: Sep. 5, 2014

(65) Prior Publication Data
US 2015/0084175 A1 Mar. 26, 2015

(30) Foreign Application Priority Data
Sep. 26, 2013 (EP) ..................... 13186180

(51) Int. Cl.
*H01L 23/49* (2006.01)
*H01L 23/495* (2006.01)
*H01L 23/433* (2006.01)
*H01L 23/498* (2006.01)
*H01L 21/56* (2006.01)

(52) U.S. Cl.
CPC ........ *H01L 23/49548* (2013.01); *H01L 21/565* (2013.01); *H01L 21/566* (2013.01); *H01L 23/4334* (2013.01); *H01L 23/49551* (2013.01); *H01L 23/49861* (2013.01); *H01L 2924/1815* (2013.01)

(58) Field of Classification Search
CPC ................... H01L 23/49548; H01L 23/49575; H01L 23/49503; H01L 23/49517
See application file for complete search history.

(56) References Cited

U.S. PATENT DOCUMENTS

| 6,462,424 | B1* | 10/2002 | Seki et al. ................... 257/778 |
| 8,564,968 | B1* | 10/2013 | Heo et al. .................... 361/767 |
| 2006/0079028 | A1 | 4/2006 | Takahashi |
| 2006/0273433 | A1* | 12/2006 | Itou et al. .................... 257/666 |
| 2013/0221511 | A1* | 8/2013 | Higgins et al. ............... 257/690 |

FOREIGN PATENT DOCUMENTS

| EP | 2 631 941 A2 | 8/2013 |
| WO | 02/09180 A1 | 1/2002 |
| WO | 03/028086 A1 | 4/2003 |
| WO | 2004/015757 A1 | 2/2004 |
| WO | 2004/068558 A2 | 8/2004 |
| WO | 2007/007239 A2 | 1/2007 |

OTHER PUBLICATIONS

Extended European Search Report for application No. 13186182.5 (Mar. 7, 2014).

* cited by examiner

*Primary Examiner* — Roy Potter
*Assistant Examiner* — Paul Patton

(57) ABSTRACT

For so called film assisted moulding (FAM) device processing techniques there is provided lead frame for a semiconductor device, comprising a base portion and a connection lead, said base portion arranged for mounting a semiconductor die, said connection lead comprising a horizontal portion for external connection and an angled portion for connection to said semiconductor die, wherein the angled portion has a positive angle with respect to the base portion. The connection lead may comprise a recessed portion.

15 Claims, 5 Drawing Sheets

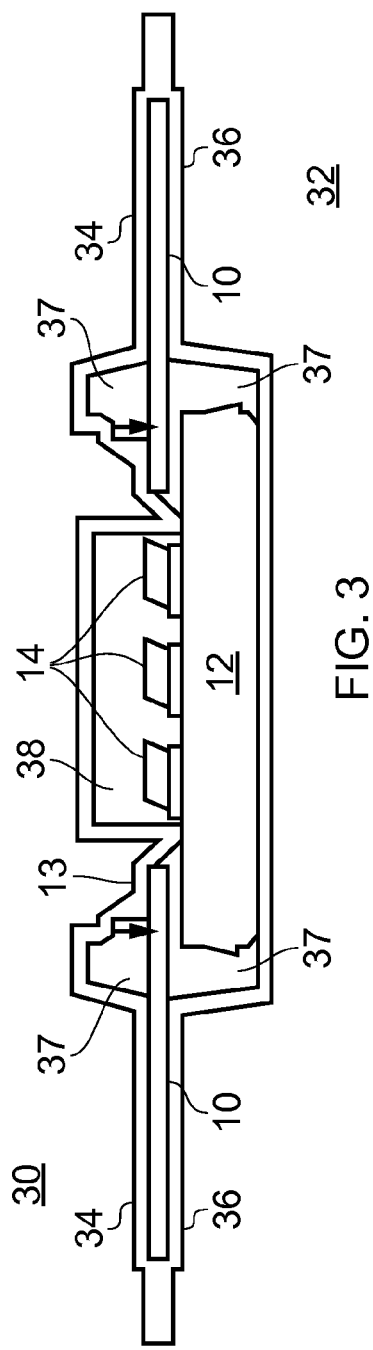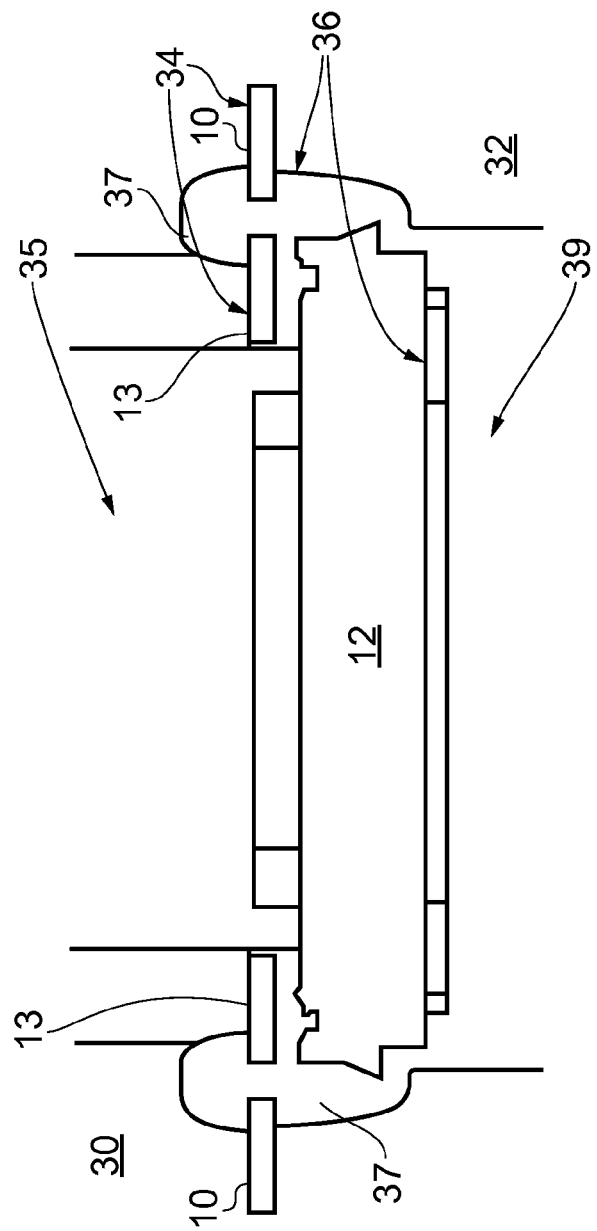

SEMICONDUCTOR DEVICE LEADFRAME

CROSS-REFERENCE TO RELATED APPLICATIONS

This application claims the priority under 35 U.S.C. §119 of European patent application no. 13186180.9, filed on Sep. 26, 2014, the contents of which are incorporated by reference herein.

FIELD

The present invention relates to lead frame for a semiconductor device. In particular, the semiconductor device may be a Radio Frequency (RF) device such as an RF amplifier. The lead frame may be suitable for use in film assisted moulding (FAM) techniques.

BACKGROUND

Semiconductor packages or encapsulations are typically formed of one or more of metal, plastic, glass, or ceramic materials which are arranged to house one or more semiconductor dies. Such packages may provide protection against impact and corrosion and dissipate heat produced in the die.

In the field of Radio Frequency (RF) electronic devices, such as for example RF power amplifier devices, RF isolation is necessary to reduce the cross-talk of signals from between channels and also RF return currents which may be induced in metal device features. RF isolation also maintains the integrity of amplified signal, and reduces system measurement uncertainties.

RF technologies device packages such as ceramic brazed package constructions or Liquid Crystal Polymer package constructions are known to provide good RF isolation and EM conduction. However these package constructions are expensive to produce.

In general it is known that plastic compound cavity moulded packages provide more cost effective alternatives to ceramics and LCP packages. However, there are a number of challenges in applying plastic mould compound encapsulations to semiconductor devices, most notably minimising and controlling so-called mould flashing (also known as mould creep or bleeding) to keep metallic floating leads, where additional electrical connections such as wire bond will be made free from mould compound. In addition RF semiconductor devices and high voltage MOSFET devices, for example, are known to be high heat dissipating devices which may therefore limit the type of plastic mould compound encapsulations and moulding techniques available. This is due to the potential for damage caused to the encapsulation caused by melting.

With reference to FIG. 1, the leads 10 of the lead frame are said to be floating. The term "floating lead" refers to the situation where prior to moulding the lead 10 is held (or floats) over a base 12 of the device package. The lead is said to "float" because it is not in direct contact with, nor supported by the base 12. During the moulding process the lead will be held at one end by clamping in the mounting machine at a dambar (not illustrated) end of the lead. Following the moulding process it will be mechanically supported by the cured mould compound, as discussed below.

The base 12 of the package is typically formed of a metallic material which functions to mount the semiconductor die (not illustrated in FIG. 1) thereon. The base 12 may also function as a heat sink for the semiconductor device die and may also allow for additional electrical connections by way of appropriate conductive contacts to the semiconductor die, such as for example back contacts on the device die connecting to the base 12.

As illustrated in FIG. 2, following encapsulation injected mould compound 16 separates the base 12 from the lead 10, and as mentioned above when cured provides mechanical support for the lead 10 on the base 12. As also mentioned, moulding techniques may result is some mould flashing occurring. Minimising mould flashing may keep a section of the leads (shown by 13) free from mould compound 16 and as such may allow the leads 10 to be wire bonded by appropriate wire bonding techniques to the semiconductor dies 14 mounted on the base 10, at a later stage of the device packaging process.

A known technique for moulding or encapsulating devices is known as Film (or Foil) Assisted Moulding (FAM). FAM is a so-called transfer moulding technique which uses plastic films in the mould in an attempt prevent liquefied mould compound from reaching certain areas of the device, such as portions of the leads to be wire bonded, during the moulding process. Other known methods for moulding include thermo-compression techniques but they do not involve the use of a film to protect against liquefied mould compound from reaching certain areas of the device.

FIGS. 3 and 4 illustrate, in general terms, a known exemplary arrangement for FAM, where the films 34, 36 is placed over the leads 10, base 12 and one or more semiconductor dies 14 which may be mounted on the base 12. In this example, two films are illustrated, a first film 34 for a top portion of the mould 30, and second film 36 for a bottom portion of the mould 32. During the FAM process the top 30 and bottom 32 portions of the mould are closed around the base 12, leads 10 and device dies 14. Pressure and heat are then applied to the films so that they are sealed around the base 12, leads 10 and device dies 14.

By sealing the films in this way a first void 38 (or cavity) is created around the device dies 14 and by the application of pressure and heat the film is sealed to the base 12 such that the dies 14 are protected from moulding compound which will be introduced later in the moulding process. In FIG. 3, for the purposes clearer illustration the relative size of the first cavity 38, compared to the other features shown has been exaggerated. A second set of cavities (also known as mould cavities) 37 are created at the top and bottom of the leads 10, where the leads overlap the base, and between the leads and the base 12. Later in the moulding process, moulding compound will be injected into the mold cavities 37, thus electrically isolating the leads 10 from the base 12. Once the mould compound has cured, it mechanically supports the leads 10 on the base 12, and the device can be released from the moulding machine.

Once the film is in place the transfer molding process takes place. Generally speaking the moulding process involves liquefied moulding material being forced into closed mould cavities 37 and held under heat and pressure by the top and bottom heat sink clamps 35, 39, as shown in FIG. 4, until the mould material is solidified and cured. The mould is then opened and the encapsulated devices are unloaded, for further device processing, such as mould flash removal and wire bonding.

Film-Assisted Molding offers a number of advantages over other transfer molding techniques and known thermo-compression techniques. These advantages include the easy release of the encapsulated products from the mold, and protection or isolation of surfaces (such as the semiconductor device die and/or leads for later wire bonding) from moulding compound.

However, for this process to be effective the film must be compressed such that it seals to prevent mould flashing of the compound escaping from the mould cavity, especially onto floating leads. Sealing is typically achieved by pressing the film onto the surfaces to be protected by the heat sink clamps 35, 39 from the top and bottom of the device as shown in FIG. 4. Also during the moulding process with the dies already in place it is necessary to keep the device dies isolated from the moulding process and the moulding compound such that the die does not get encapsulated thereby allowing the die to be wire bonded to the leads post-molding.

Due to the nature of the floating leads it can difficult to apply sufficient sealing pressure using heat sink clamps during the moulding process because the leads are floating and not supported by the base 12. The leads are not supported by the base because it is necessary that the leads are electrically isolated from the base. During FAM it is desirable to apply pressure to the film to prevent compound from bleeding. However, if the pressure applied is too great this will deform the lead downwards, resulting in an downward angled (towards the base 12) lead frame surface. The downward deformation makes it difficult to wirebond the leadframe to the device die after the moulding process is complete.

Mould flashing (or polymer bleeds) on semiconductor device leads are a major problem for device manufacturers because they significantly degrade the solderability of the leads and specifically for surface mount devices bleeds can cause misalignments between the printed circuit board (PCB) and can result in the device being tilted on the PCB. Furthermore, the flashes may fall-off during the process of mounting devices on to PCBs due to vibrations occurring during the device mounting process. The loose flash material can fall onto the solderable area of the PCB also causing the device to be partially or not to be soldered which can also result to package tilting on the PCB.

A known solution to the problem of mould flashing (or polymer bleeds) is simply to remove the unwanted polymer material from the leads after the moulding process has been completed. Removal method for polymer bleeds from the leads can be chemical such as a chemical etch, or by mechanically etching. However, such removal methods introduce a further processing step which can in turn add to the time and cost of producing devices.

SUMMARY

The present invention seeks to provide a lead frame for a semiconductor device which mitigates or overcomes at least one of the above mentioned problems.

According to a first aspect there is provided a lead frame for a semiconductor device manufactured by film assisted moulding, the lead frame comprising: a connection lead, the connection lead comprising a connection portion for electrical connection to a semiconductor die, wherein an edge of said connection portion comprises a recessed portion wherein the recessed portion is arranged to seal against a film during moulding of the semiconductor device.

The recessed portion may act as a reservoir to collect any mould compound that may bleed during the moulding process so as to prevent any mould compound from bleeding on to the lead. The recessed portion may also act to locally deform the film such that during manufacture of the semiconductor device the film sits in the recessed portion to create an improved seal against mould bleeding or flashing.

The lead frame may comprising: a base portion; wherein the base portion comprises an upper surface arranged for mounting one or more semiconductor device dies, wherein the connection lead comprises a portion arranged horizontally with respect to the upper surface of the base portion for external connection and an angled tip portion for connection to the semiconductor die, and wherein the angled portion is arranged to seal against a film during moulding of the semiconductor device.

During film assisted moulding of semiconductor devices arrangements as described allow the lead frame to seal against a film and there by prevent mould bleeding or flashing onto the leads.

DESCRIPTION OF THE DRAWINGS

The invention is described further hereinafter by way of example only with reference to the accompanying drawings in which:

FIG. 3 is a schematic cross-sectional illustration of a film applied in a FAM arrangement;

FIG. 4 is a cross-sectional illustration of a FAM arrangement according to an embodiment;

In the figures and the following description like reference numerals refer to like features.

With reference the known arrangements of FIGS. 1, 2, 3 and 4 the leads 10 may be arranged to be substantially parallel with respect to the base 12 such that the angle between base and the leads is substantially zero. In this context substantially parallel is within ±1 degrees off the zero degree horizontal, in line with current manufacturing tolerances of lead frames. The zero degree horizontal is defined by the upper surface of the base 12 onto which the device dies 14 will be mounted.

Leads 10 which are substantially parallel, with respect to the base, may result in excessive bleeding of mould compound on to the leads 10. Furthermore, leads angled downwards in the direction towards the base 12 (in other words, a negative angle with respect to the base) may increase the risk of bleeding of mould compound onto the lead 10 because the film will not contact the end of the leads 10 and seal the lead against the film.

Figure 1:
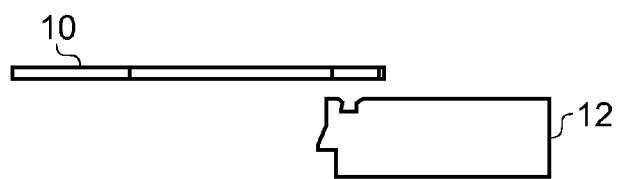
FIG. 1 is an illustration of a floating lead and base.
Figure 2:
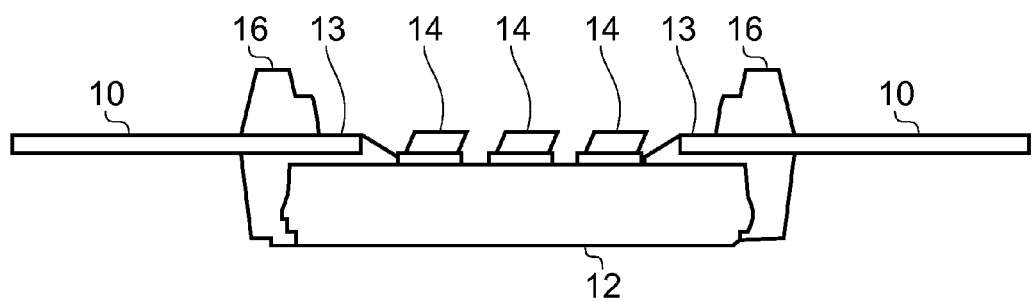
FIG. 2 is a cross-sectional illustration of the floating lead and base encapsulated in mould compound.
Figure 5:
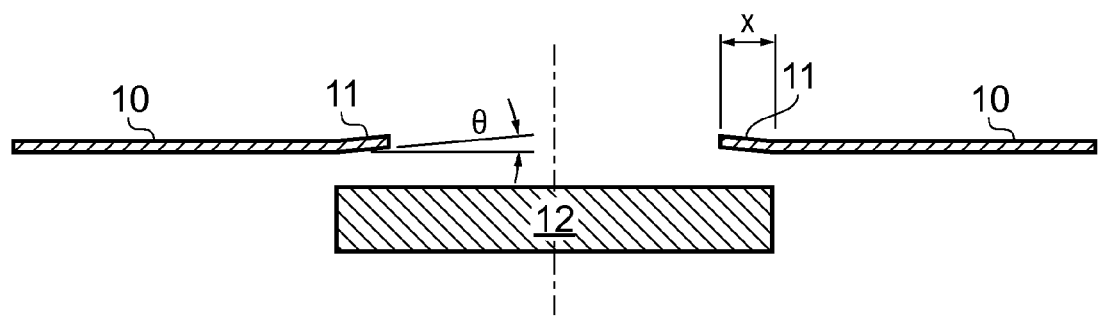
FIG. 5 is a cross-sectional illustration of a floating lead and base according to an embodiment.

However, in accordance with an embodiment and with reference to FIG. 5, leads 10 may be arranged such that they can provide an improved seal against bleeding of mould compounds.

As shown in FIG. 5 a tip portion 11 of a lead 10 has a positive angle 8 degrees with respect to the base 12. In this context the tip portion 11 subtends a positive angle with respect to a surface of the base 12 arranged to mount semiconductor dies 14. The tip portion 11 may overlap with the base portion 12 by a distance x. The distance x may be in the region of 0.5 to 1.2 mm and may typically be 1 mm. If the distance x is increased then the clamping point at the dambar (not illustrated) will be further away from the tip portion 11. The length between the dambar and lead tip will increase and thus the lead will be less rigid such that the force of the tip against the film will be less, thereby resulting in greater risk of bleeds or mould flashes. The remainder of the lead (that is, not the tip portion) will be substantially parallel to the surface of the base 12 arranged to mount semiconductor dies 14, as discussed above.

In FIG. 5, the positive angle θ may be 4 degrees ±1 degree. The positive angle of the lead 10 may be between 3 and 10 degrees. By angling the tip portion 11 of the lead 10 in this way, bleeding of the mould compound may be eliminated. This may be due to the force of the tip portion pressing against the film being higher than would be the case if the lead were not angled.

Therefore, during the moulding process, due to the positive angled tip portion of the lead, the may be pressed into the foil resulting in an improved seal and thus preventing bleeds between the foil and the lead surface.

The thickness of the lead should be between 0.2 mm and 0.5 mm (with a tolerance of ±0.008 mm). The thickness of the lead 10 is may be chosen such that the tip portion can be deformed by the pressure during the moulding process, such that following the moulding process the tip portion is substantially horizontal with respect to the surface of the base 12 arranged to mount semiconductor dies 14.

Whilst the lead may be substantially horizontal following this process, there may remain on the lead a tell tail bend mark. This mark is a result of the metal lead having been angled to the required positive angle θ as discussed above and then deformed to be substantially flat during the moulding process. Such marks are well known to those skilled in the art.

The thickness of the lead should be such that it is rigid enough to create a seal between the lead and the foil. If the thickness of the lead is too thin, that is less than 0.2 mm the rigidity of the lead will be lower such that the contra pressure, created by the top heat sink clamp 35, will result in deformation of the lead without creating a seal and this may result in bleeding between the lead and the foil. In the present context, contra pressure is the reactive force from the lead to foil when the foil presses on the lead.

The foregoing discussion relates to the situation where the base is in-situ prior to the moulding process. However, the stilled person will recognise that plastic bases may be moulded during the moulding process following which device dies 14 may be attached thereto for later wire bonding to the leads 10.

Such an arrangement is typically used for MEMS pressure sensors. Where semiconductor dies mounted on the moulded base following the moulding process.

Figure 6A:
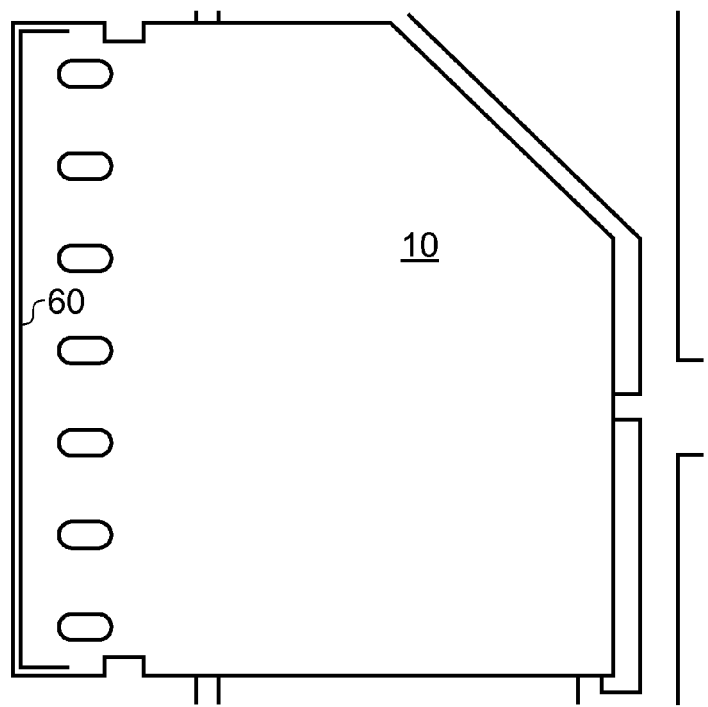
FIG. 6a is a plan view of a floating lead according to an embodiment
Figure 6B:
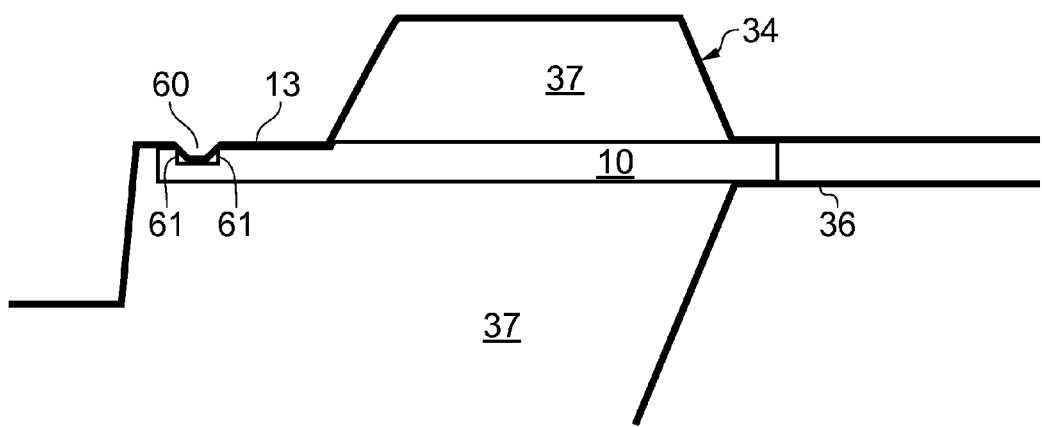
FIG. 6b is a cross-sectional illustration showing a floating lead according to an embodiment.
Figure 6C:
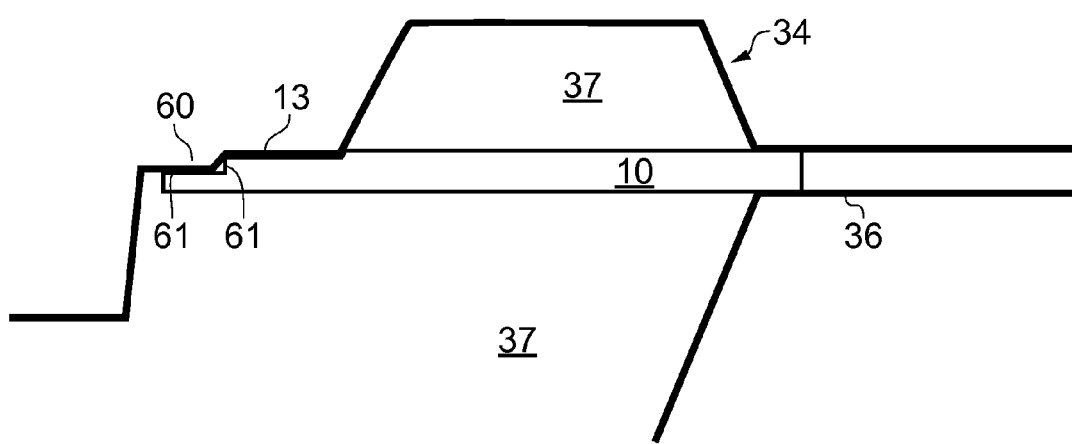
FIG. 6c is a cross-sectional illustration showing a floating lead according to an embodiment.

Referring now to FIGS. 6a to 6c the lead 10 may also include a recessed portion 60 in the form of a groove, trench or step which extends around the edge of the lead 10 proximal to the region of the base 12 where the semiconductor die 14, to be electrically connected to the lead, will be placed on the base 12. That is, edge of the lead 10 which may face the mounted semiconductor die. As shown in FIG. 6a, the recessed portion 60 may extend along the edge of the lead facing the semiconductor die 14. The recessed portion 60 may also extend partially along edges side of the lead which meet the edge of the lead 10 facing the semiconductor die 14.

Due to the step-like or grooved nature of the recess portion 60, the recessed portion may have additional edges 61 formed by the step or groove. The edges 61 of the recessed portion may function to contact the foil 34 during the FAM process and cause a local deformation of the foil 34 in the recessed portion 60. This local deformation of the foil creates a barrier in the foil 34 and prevents bleeding of the mould compound on to the area of the lead 10 which should be kept free of mould compound.

As illustrated in FIG. 6b the recessed portion may be a groove or trench feature in the lead. The foil 34 may be locally deformed into the recessed portion 60 creating a barrier to flow of mould compound. Similarly, the recessed portion is illustrated in FIG. 6c may be a step feature in the lead. Again, as with the example of FIG. 6b, the step feature causes a local deformation of the foil into the recessed portion creating a barrier to flow of mould compound.

The recessed portion may also act as a reservoir to collect any mould compound that may bleed during the moulding process so as to prevent any mould compound from bleeding on to the lead.

The recessed portion may be formed in the metal lead by any suitable process, for example by coining or stamping, or mechanical or chemical etching.

Although FIGS. 6a to 6c, do not show an angled tip portion of the leads 10, the skilled person will understand that angled tip portion may be used in conjunction with the recessed portion.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

For the sake of completeness it is also stated that the term "comprising" does not exclude other elements or steps, the term "a" or "an" does not exclude a plurality. Reference signs in the claims shall not be construed as limiting the scope of the claims.

The invention claimed is:

1. A lead frame for a semiconductor device manufactured by film assisted moulding, the lead frame comprising:
   a connection lead, the connection lead comprising
      a connection portion for electrical connection to a semiconductor die, having a bond wire portion,
   wherein an edge of said connection portion comprises
      a recessed portion
   wherein the recessed portion is arranged to seal against a film assisted moulding film during moulding of the semiconductor device;
   further comprising a mould compound; and
   wherein the seal between the recessed portion and the film is configured to block the mould compound from contacting the bond wire portion.

2. The lead frame of claim 1, wherein the recessed portion is a step portion or a groove portion.

3. The lead frame of claim 1, wherein said recessed portion is arranged to locally deform said film during manufacture of said semiconductor device.

4. The lead frame of claim 1 further comprising:
a base portion;
  wherein the base portion comprises an upper surface arranged for mounting one or more semiconductor device dies,
  wherein the connection lead comprises a portion arranged horizontally with respect to the upper surface of the base portion for external connection and an angled tip portion for connection to the semiconductor die, and
  wherein the angled portion is arranged to seal against a film during moulding of the semiconductor device.

5. The lead frame of claim 4, wherein the angled tip portion is arranged to be resiliently biased against the film.

6. The lead frame of claim 5, angled portion tip subtends a positive angle with respect to the upper surface of the base portion of between 3 and 5 degrees.

7. The lead frame of claim 6, wherein said positive angle is 4 degrees.

8. The lead frame of claim 1, wherein the connection lead is a floating lead.

9. The lead frame of claim 8, wherein said floating lead is physically isolated from a base portion;
  wherein the base portion comprises an upper surface arranged for mounting a semiconductor device die.

10. The lead frame of claim 1, wherein the film is an upper portion of a film used in film assisted moulding.

11. The lead frame of claim 9, wherein the floating lead substantially overlaps the base portion.

12. The lead frame of claim 1, wherein the connection portion is arranged to such that following moulding it is substantially horizontal with respect to said base portion.

13. The lead frame of claim 9, wherein the thickness of said lead is between 0.2 mm and 0.5 mm.

14. The lead frame of claim 1, wherein the semiconductor device is an RF device.

15. The lead frame of claim 11, wherein the RF device is an amplifier device.

* * * * *